(12) United States Patent
Ma

(10) Patent No.: US 10,930,281 B2
(45) Date of Patent: Feb. 23, 2021

(54) METHOD, APPARATUS AND SYSTEM FOR TESTING INTELLIGENT VOICE DEVICE

(71) Applicant: Beijing Baidu Netcom Science and Technology Co., Ltd., Beijing (CN)

(72) Inventor: Chen Ma, Beijing (CN)

(73) Assignee: Beijing Baidu Netcom Science and Technology Co., Ltd., Beijing (CN)

( * ) Notice: Subject to any disclaimer, the term of this patent is extended or adjusted under 35 U.S.C. 154(b) by 101 days.

(21) Appl. No.: 16/354,635

(22) Filed: Mar. 15, 2019

(65) Prior Publication Data

US 2019/0371322 A1 Dec. 5, 2019

(30) Foreign Application Priority Data

May 31, 2018 (CN) .......................... 201810551684.2

(51) Int. Cl.
*G10L 15/22* (2006.01)
*G10L 15/08* (2006.01)

(52) U.S. Cl.
CPC .............. *G10L 15/22* (2013.01); *G10L 15/08* (2013.01); *G10L 2015/088* (2013.01); *G10L 2015/223* (2013.01)

(58) Field of Classification Search
CPC .......... G10L 15/22; G10L 25/60; H04R 29/00
See application file for complete search history.

(56) References Cited

U.S. PATENT DOCUMENTS

| 7,885,817 | B2 * | 2/2011 | Paek ....................... G10L 13/00 704/270 |
| 2006/0085187 | A1 * | 4/2006 | Barquilla ................ G10L 13/08 704/243 |
| 2016/0379638 | A1 * | 12/2016 | Basye ..................... G10L 15/18 704/235 |
| 2018/0272490 | A1 * | 9/2018 | Brenner .................... F16F 7/04 |
| 2018/0321905 | A1 * | 11/2018 | Fountaine ............... G06F 3/165 |
| 2020/0171665 | A1 * | 6/2020 | Kono ..................... B25J 9/1612 |
| 2020/0206923 | A1 * | 7/2020 | Pivac ..................... B25J 9/1638 |

FOREIGN PATENT DOCUMENTS

| CN | 107613447 | * | 1/2018 | ............. H04R 29/00 |
| CN | 107613447 A | | 1/2018 | |

* cited by examiner

*Primary Examiner* — Douglas Godbold
(74) *Attorney, Agent, or Firm* — Nixon Peabody LLP

(57) ABSTRACT

Embodiments of the present disclosure disclose a method, apparatus and system for testing an intelligent voice device. A specific implementation of the method includes: acquiring test data, the test data comprising: to-be-executed field control data and to-be-played voice data; sending, based on the to-be-executed field control data, a first motion instruction to the omnidirectional mobile mechanism connected to the intelligent voice device and/or the voice playing device; sending a playing instruction, in response to determining that a relative pose of the intelligent voice device and the voice playing device is the target relative pose; receiving predefined device information, associated with the voice recognition, of the intelligent voice device; and generating a test result based on the device information.

17 Claims, 8 Drawing Sheets

METHOD, APPARATUS AND SYSTEM FOR TESTING INTELLIGENT VOICE DEVICE

CROSS-REFERENCE TO RELATED APPLICATIONS

This application claims priority to Chinese Patent Application No. 201810551684.2, filed on May 31, 2018, titled "Method, apparatus and system for testing intelligent voice device," which is hereby incorporated by reference in its entirety.

TECHNICAL FIELD

Embodiments of the present disclosure relate to the field of computer technology, specifically to a method, apparatus and system for testing an intelligent voice device.

BACKGROUND

With the development of voice recognition technology, the application of the voice recognition technology includes voice dialing, voice navigation, indoor device control, voice document retrieval, simple dictation data entry and the like. The voice recognition technology combined with other natural language processing technologies such as machine translation and voice synthesis technology may build more sophisticated intelligent voice applications. An intelligent voice device obtained by mounting the intelligent voice application on the device may facilitate a user to interact with the device using a natural language, realizing various functions.

SUMMARY

Embodiments of the present disclosure provide a method, apparatus and system for testing an intelligent voice device.

In a first aspect, the embodiments of the present disclosure provide a method for testing an intelligent voice device, the method including: acquiring test data, wherein the test data includes: to-be-executed field control data and to-be-played voice data, the to-be-executed field control data indicates a target relative pose between a voice playing device and an intelligent voice device, and at least one of the intelligent voice device or the voice playing device is connected to an omnidirectional mobile mechanism; sending, based on the to-be-executed field control data, a first motion instruction to the omnidirectional mobile mechanism connected to the intelligent voice device and/or the voice playing device; sending a playing instruction, in response to determining that a relative pose of the intelligent voice device and the voice playing device is the target relative pose, wherein the playing instruction is associated with the to-be-played voice data, and the intelligent voice device performs voice recognition on a received voice; receiving predefined device information, associated with the voice recognition, of the intelligent voice device; and generating a test result based on the device information.

In a second aspect, the embodiments of the present disclosure provide an apparatus for testing an intelligent voice device, the apparatus including: an acquiring unit, configured to acquire test data, the test data includes: to-be-executed field control data and to-be-played voice data, wherein the to-be-executed field control data indicates a target relative pose between a voice playing device and an intelligent voice device, and at least one of the intelligent voice device or the voice playing device is connected to an omnidirectional mobile mechanism; a first sending unit, configured to send, based on the to-be-executed field control data, a first motion instruction to the omnidirectional mobile mechanism connected to the intelligent voice device and/or the voice playing device; a second sending unit, configured to send a playing instruction, in response to determining that a relative pose of the intelligent voice device and the voice playing device is the target relative pose, wherein the playing instruction is associated with the to-be-played voice data, and the intelligent voice device performs voice recognition on a received voice; a receiving unit, configured to receive predefined device information, associated with the voice recognition, of the intelligent voice device; and a generation unit, configured to generate a test result based on the device information.

In a third aspect, the embodiments of the present disclosure provide a system for testing an intelligent voice device, the system including: a control device, configured to: acquire test data, wherein the test data includes: to-be-executed field control data and to-be-played voice data, the to-be-executed field control data indicates a target relative pose between a voice playing device and an intelligent voice device; send, based on the to-be-executed field control data, a first motion instruction to an omnidirectional mobile mechanism connected to the intelligent voice device and/or the voice playing device; and send a playing instruction, in response to determining that a relative pose of the intelligent voice device and the voice playing device is the target relative pose, wherein the playing instruction is associated with the to-be-played voice data; the omnidirectional mobile mechanism, configured to connect to at least one of the intelligent voice device or the voice playing device, in response to receiving the first motion instruction; the voice playing device, configured to play a voice indicated by the to-be-played voice data associated with the received playing instruction; and the intelligent voice device, configured to: perform voice recognition on a received voice; collect and send predefined device information, associated with the voice recognition, of the intelligent voice device; wherein the control device is further configured to: receive the predefined device information, associated with the voice recognition, of the intelligent voice device; and generate a test result based on the device information.

In a fourth aspect, the embodiments of the present disclosure provide an electronic device, including: one or more processors; and a storage apparatus, storing one or more programs thereon, wherein the one or more programs, when executed by the one or more processors, cause the one or more processors to implement the method according to any one of the embodiments in the first aspect.

In a fifth aspect, the embodiments of the present disclosure provide a computer readable medium, storing a computer program thereon, wherein the computer program, when executed by a processor, implements the method according to any one of the embodiments in the first aspect.

The method, apparatus and system for testing an intelligent voice device provided by the embodiments of the present disclosure, after acquiring test data, based on the to-be-executed field control data, sending a first motion instruction to the omnidirectional mobile mechanism connected to the intelligent voice device and/or the voice playing device, so that the arrangement of a test scenario may be automatically completed; and after determining that the relative pose of the intelligent voice device and the voice playing device is the target relative pose, that is, after determining that the test scenario is arranged, sending a playing instruction and receive device information of the intelligent voice device, and generating a test result based on the device information, thus a new method for testing an intelligent voice device is provided.

BRIEF DESCRIPTION OF THE DRAWINGS

After reading detailed descriptions of non-limiting embodiments with reference to the following accompanying drawings, other features, objectives and advantages of the present disclosure will become more apparent.

DETAILED DESCRIPTION OF EMBODIMENTS

The present disclosure will be further described below in detail in combination with the accompanying drawings and the embodiments. It should be appreciated that the specific embodiments described herein are merely used for explaining the relevant disclosure, rather than limiting the disclosure. In addition, it should be noted that, for the ease of description, only the parts related to the relevant disclosure are shown in the accompanying drawings.

It should also be noted that the embodiments in the present disclosure and the features in the embodiments may be combined with each other on a non-conflict basis. The present disclosure will be described below in detail with reference to the accompanying drawings and in combination with the embodiments.

Figure 1:
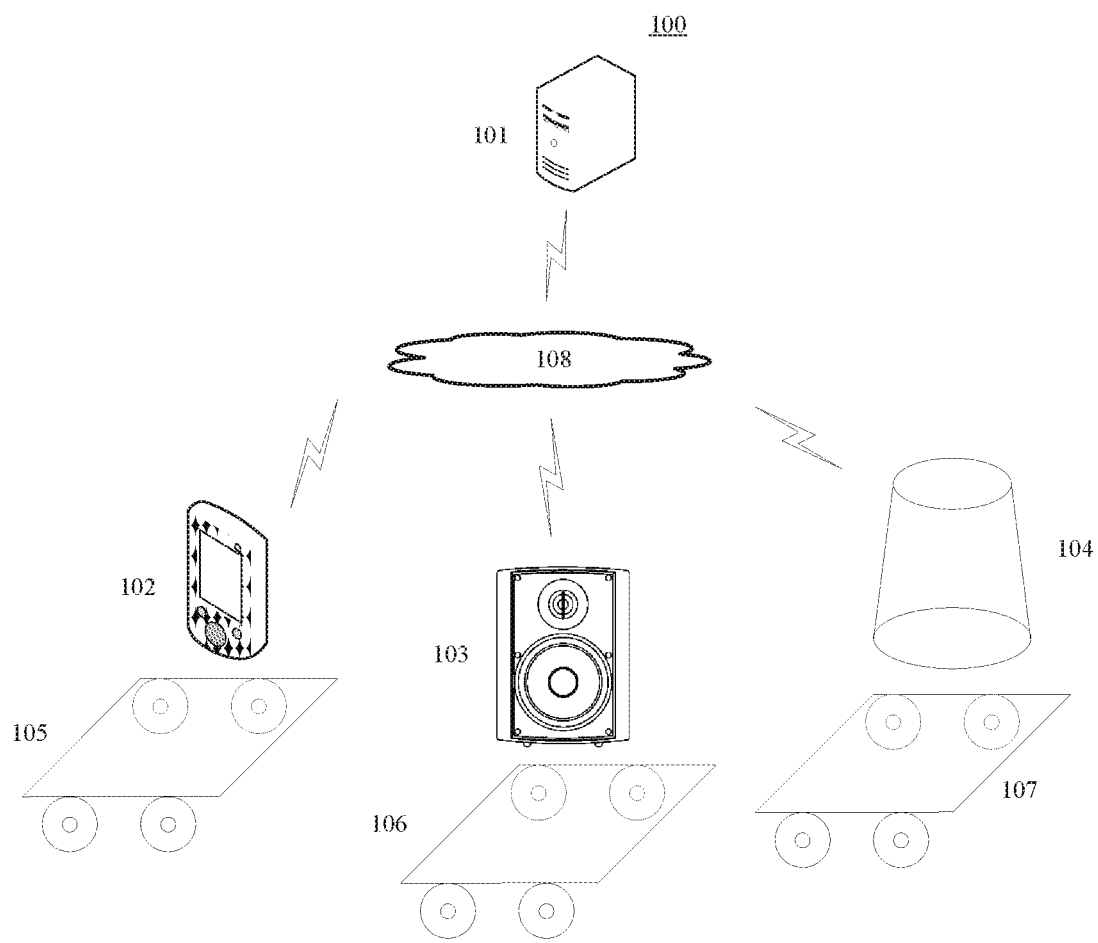
FIG. 1 is an exemplary system architecture diagram to which the present disclosure may be applied.

FIG. 1 illustrates an exemplary system architecture 100 to which an embodiment of a method for testing an intelligent voice device or an apparatus for testing an intelligent voice device of the present disclosure may be applied.

As shown in FIG. 1, the system architecture may include a control device 101, voice playing devices 102, 103, an intelligent voice device 104, omnidirectional mobile mechanisms 105, 106, 107, and a network 108. The network 108 is configured to provide a communication link medium between the control device 101 and the voice playing devices 102, 103, between the control device 101 and the intelligent voice device 104, and between the control device 101 and the omnidirectional mobile mechanisms 105, 106 and 107.

The network 108 may include various types of connections, such as wired, wireless communication links, optical fibers, or the like. Optionally, the network 108 may be a wireless communication link. The wireless connection may include but is not limited to 3G/4G connection, WiFi connection, Bluetooth connection, WiMAX connection, Zigbee connection, UWB (ultra wideband) connection, and other wireless connections that are now known or to-be-developed in the future.

The control device 101 may interact with the voice playing devices 102, 103 via the network 108 to receive or send messages and the like. Various communication client applications, such as instant communication tools, and voice playing applications may be installed on the voice playing devices 102 and 103.

The control device 101 may interact with the intelligent voice device 104 via the network 108 to receive or send messages and the like. Various communication client applications, such as instant communication tools, voice recognition applications, and device parameter collection applications may be installed on the intelligent voice device 104.

The control device 101 may be a terminal device, or may be a server.

When the control device 101 is a terminal device, the terminal device may be hardware or software. When the terminal device as the control device 101 is hardware, the terminal device may be various electronic devices having a control function and a communication function, including but not limited to a terminal device or a server. If the control device 101 is a terminal device, the control device 101 may include, but is not limited to, a smart phone, a tablet, an e-book reader, an MP3 (Moving Picture Experts Group Audio Layer III) player, a MP4 (Moving Picture Experts Group Audio Layer IV) player, a laptop portable computer and a desktop computer, etc. When the terminal device as the control device 101 is software, the terminal device may be installed in the above-listed electronic devices. The terminal device may be implemented as a plurality of software programs or software modules or as a single software program or software module, which is not specifically limited in the present disclosure.

When the control device 101 is a server, the control device 101 may be a server that provides various services, such as a background server that provides support for the voice playing function of the voice playing devices 102, 103 and/or the voice recognition function of the intelligent voice device 104. The background server may issue instructions to control the actions of the voice playing devices 102, 103 and the intelligent voice device 104. It should be noted that the server may be hardware or software. When the server is hardware, the server may be implemented as a distributed server cluster composed of a plurality of servers, or as a single server. When the server is software, the server may be implemented as a plurality of software programs or software modules (e.g., for providing distributed services), or as a single software program or software module, which is not specifically limited in the present disclosure.

The voice playing devices 102, 103 may be hardware or software. When the voice playing devices 102, 103 are hardware, the voice playing devices 102, 103 may be various electronic devices having a voice playing function, including but not limited to smart phones, tablets, e-book readers, MP3 (Moving Picture Experts Group Audio Layer III) players, MP4 (Moving Picture Experts Group Audio Layer IV) players, laptop portable computers and desktop computers, etc. When the voice playing devices 102, 103 are software, the voice playing devices 102, 103 may be installed in the above-listed electronic devices. The voice playing devices 102, 103 may be implemented as a plurality of software programs or software modules or as a single software program or software module, which is not specifically limited in the present disclosure.

The intelligent voice device 104 may be hardware or software. When the intelligent voice device 104 is hardware, the intelligent voice device 104 may be various electronic devices having a voice recognition function, including but not limited to a smart phone, a tablet, an e-book reader, an MP3 (Moving Picture Experts Group Audio Layer III) player, a MP4 (Moving Picture Experts Group Audio Layer IV) player, a laptop portable computer and a desktop computer, etc. When the intelligent voice device 104 is software, the intelligent voice device 104 may be installed in the above-listed electronic devices. The intelligent voice device 104 may be implemented as a plurality of software programs or software modules or as a single software program or software module, which is not specifically limited in the present disclosure.

The control device 101 may interact with the omnidirectional mobile mechanisms 105, 106, 107 via the network 108 to receive or send messages and the like. The omnidirectional mobile mechanisms 105, 106, 107 may be connected to the voice playing device and/or the intelligent voice device. For example, the omnidirectional mobile mechanism 105 in FIG. 1 is connected to the voice playing device 102, the omnidirectional mobile mechanism 106 is connected to the voice playing device 103, and the omnidirectional mobile mechanism 107 is connected to the intelligent voice device 104.

It should be noted that the omnidirectional mobile mechanisms 105, 106, 107 may have their own separate central controller. The omnidirectional mobile mechanism may further include a mechanical motion mechanism without a central controller, and the mechanical motion mechanism is controlled by the central controller of the connected intelligent voice device or voice playing device; in this case, the omnidirectional mobile mechanism may be considered as a part of the intelligent voice device or the voice playing device, that is, the intelligent voice device or the voice playing device has the function of omnidirectional movement.

It should be noted that the intelligent voice device 104 and the voice playing devices 102, 103 may both be connected to an omnidirectional mobile mechanism, that is, the omnidirectional mobile mechanisms 105, 106 and 107 are all present. It is also possible that one or two of the intelligent voice device 104 and the voice playing devices 102, 103 are connected to an omnidirectional mobile mechanisms, i.e., one or two of the omnidirectional mobile mechanisms 105, 106, 107 are not present.

It should be noted that the method for testing an intelligent voice device provided by the embodiments of the present disclosure is generally performed by the control device 101. Accordingly, the apparatus for testing an intelligent voice device is generally disposed in the control device 101.

It should be understood that the number of control devices, voice playing devices, intelligent voice devices, omnidirectional mobile mechanisms, and networks included in the system architecture in FIG. 1 is merely illustrative. Depending on the implementation needs, there may be any number of terminal devices, networks, and servers.

Figure 2:
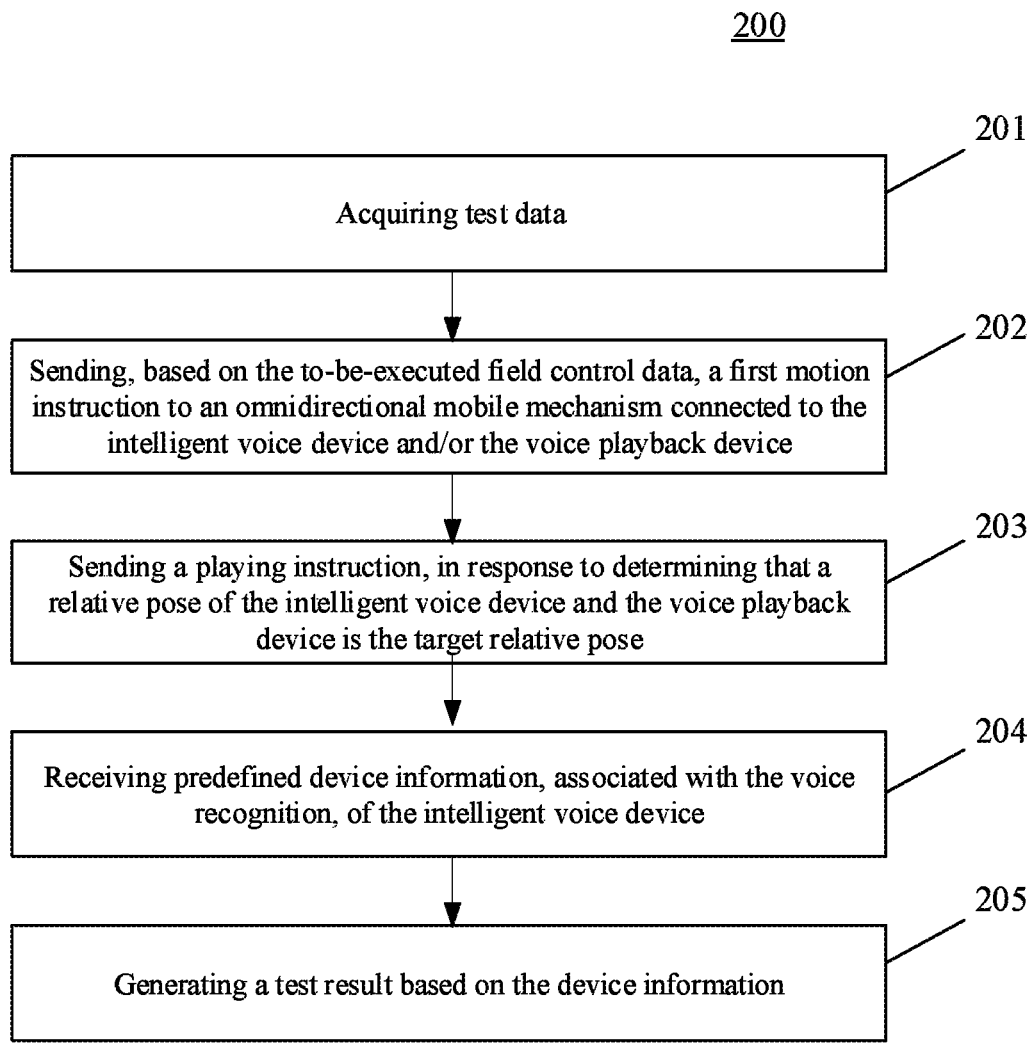
FIG. 2 is a flowchart of an embodiment of a method for testing an intelligent voice device according to the present disclosure.

Referring to FIG. 2, a flow 200 of an embodiment of a method for testing an intelligent voice device is shown. The present embodiment mainly illustrates and gives an example by the method being applied to an electronic device having a certain computing capability, and the electronic device may be the control device 101 shown in FIG. 1. The method for testing an intelligent voice device includes the following steps.

Step 201, acquiring test data.

In the present embodiment, an executing body (for example, the control device 101 shown in FIG. 1) of the method for testing an intelligent voice device may acquire test data.

In the present embodiment, the test data may include: to-be-executed field control data and to-be-played voice data.

In the present embodiment, the to-be-executed field control data is used to indicate a target relative pose between the voice playing device and the intelligent voice device. Here, the pose may include position and posture. The relative pose may be relative positional relationship and angle relationship between the voice playing device and the intelligent voice device.

In the present embodiment, the to-be-played voice data may be voice data waiting to be played. The voice data may be executed by an electronic device such that the electronic device may generate a voice.

In the present embodiment, at least one of the intelligent voice device or the voice playing device is connected to an omnidirectional mobile mechanism.

In the present embodiment, the omnidirectional mobile mechanism may be a motion mechanism capable of omnidirectional movement. Omnidirectional movement refers to movement over a full 360-degree range. The motion mechanism may be capable of achieving a combination of at least one hardware of motion. The omnidirectional mobile mechanism may perform linear movement or 360-degree rotation, and may complete curvilinear movement. As an example, the omnidirectional mobile mechanism may include, but is not limited to, an omnidirectional mobile chassis.

In the present embodiment, the to-be-executed field control data may include, but is not limited to, at least one of the following: a relative distance, a first angle, or a second angle. Here, the relative distance is a distance between the intelligent voice device and the voice playing device. The first angle may be used to indicate: an angle between a center point connection line of the intelligent voice device and the voice playing device projected at a ground plane, and a predefined first central axis in a horizontal direction of the intelligent voice device. The second angle may be used to indicate: an angle between a predefined second central axis in a horizontal direction of the voice playing device, and the predefined first central axis in the horizontal direction of the intelligent voice device.

For example, the target relative pose may include: a relative distance of 5 meters, a first angle of 30 degrees, and a second angle of 60 degrees.

Figure 3:
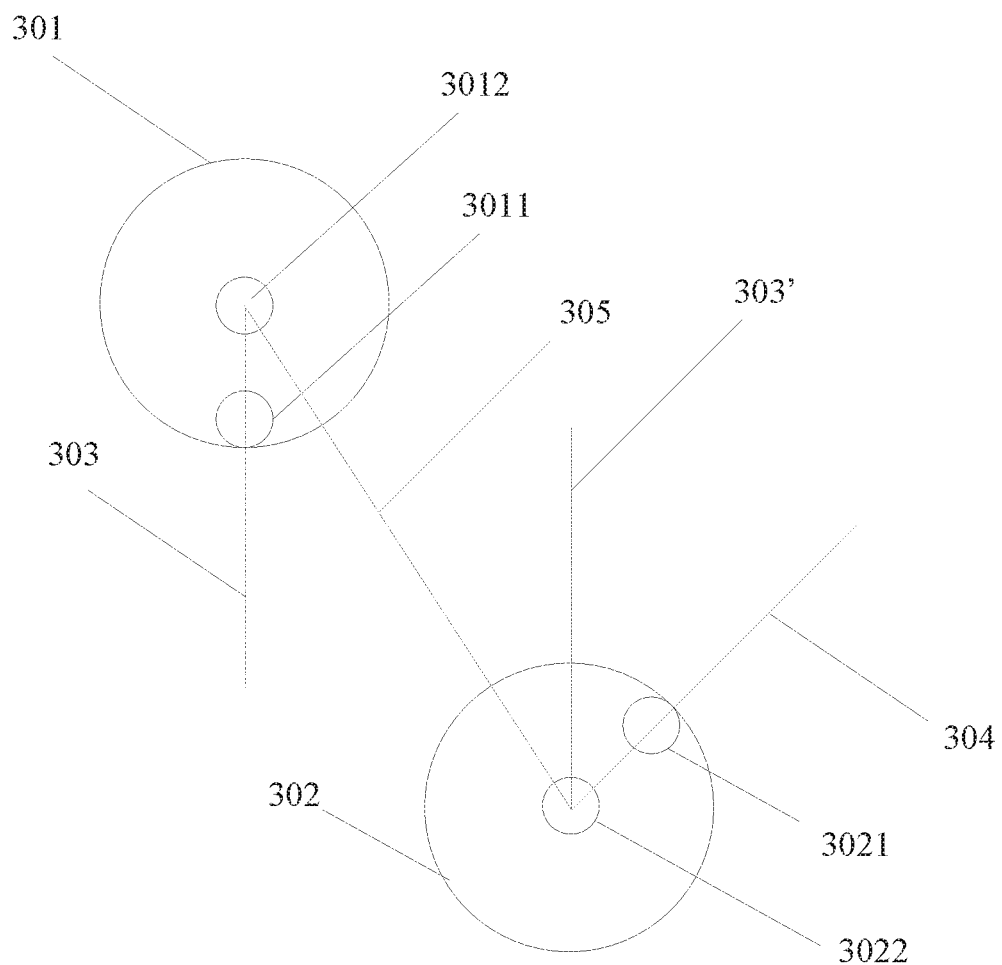
FIG. 3 is a schematic diagram of a relative pose definition mode of an intelligent voice device and a voice playing device according to the present application.

As an example, referring to FIG. 3, for an intelligent voice device 301, a certain position may be defined as a front end. For example, the intelligent voice device 301 may include a predefined front end 3011, and the projection of the connection line of the front end 3011 and a center point 3012 of the intelligent voice device 301 in the horizontal direction may be defined as a predefined first central axis 303 in the horizontal direction of the intelligent voice device 301. For a voice playing device 302, a certain position may be defined as a front end. For example, the voice playing device 302 may include a predefined front end 3021, and the projection of the connection line of the front end 3021 and a center point 3022 of the voice playing device 302 in the horizontal direction may be defined as a predefined second central axis 304 in the horizontal direction of the above voice playing device 302. It should be noted that the front end 3011, the central point 3012, the front end 3021, and the center point 3022 are illustrated by circles in FIG. 3 for convenience of illustration, but it does not mean that the center points are circles.

In FIG. 3, the connection line 305 between the center point 3012 and the center point 3022 represents the distance between the intelligent voice device 301 and the voice playing device 302. The angle between the first central axis 303 and the connection line 305 is the first angle. To facilitate the illustration of the second angle, the first central axis 303 is moved in parallel to be intersected with the second central axis 304 to provide a first central axis 303'. The angle between the first central axis 303' and the second central axis 304 is the second angle.

In some optional implementations of the present embodiment, the to-be-executed field control data may further include a vertical distance and a pitch angle. The vertical distance and the pitch angle are similar to the above-described horizontal distance and angle relationship. The distance and angle in the horizontal direction and the vertical direction may be combined, and exist at the same time. It mainly simulates the test effect of recognizing or waking up when the user is looking down or raising his head to articulate above or below the device.

Step 202, sending, based on the to-be-executed field control data, a first motion instruction to an omnidirectional mobile mechanism connected to the intelligent voice device and/or the voice playing device.

In the present embodiment, an executing body (for example, the control device shown in FIG. 1) of the method for testing an intelligent voice device may send, based on the to-be-executed field control data, the first motion instruction to the omnidirectional mobile mechanism connected to the intelligent voice device and/or the voice playing device.

In the present embodiment, the executing device may send the first motion instruction to the omnidirectional mobile mechanism, in response to acquiring the to-be-executed field control data. The omnidirectional mobile mechanism that receives the first motion instruction may start to move so that the device connected to the omnidirectional mobile mechanism may move its position or rotate. For example, the intelligent voice device and/or the voice playing device.

In some optional implementations of the present embodiment, the first motion instruction issued by the executing device may indicate the movement of the omnidirectional mobile mechanism, but does not indicate which position or posture to move, as long as the relative pose between the intelligent voice device and the voice playing device is changed.

In some optional implementations of the present embodiment, the executing device may acquire a first pose of the intelligent voice device and a second pose of the voice playing device, and determine the relative pose between the first pose and the second pose. Then, the executing device may compare the relative pose and the target relative pose, determine the distance and angle to be moved by the intelligent voice device and/or the voice playing device, to achieve the target relative pose. Combining the first pose, and the distance and angle that the intelligent voice device needs to move, the third pose of the intelligent voice device may be obtained; and combining the second pose, and the distance and angle that the voice playing device needs to move, the fourth pose of the voice playing device may be obtained. In this case, the first motion instruction issued by the executing device may be associated with the third pose data and/or the fourth pose data.

In some optional implementations of the present embodiment, the intelligent voice device may be connected to the omnidirectional mobile mechanism. The voice playing device is not connected to the omnidirectional mobile mechanism. In this case, the control device may send the first motion instruction to the omnidirectional mobile mechanism connected to the intelligent voice device.

In some optional implementations of the present embodiment, the voice playing device may be connected to the omnidirectional mobile mechanism. The intelligent voice device is not connected to the omnidirectional mobile mechanism. In this case, the control device may send the first motion instruction to the omnidirectional mobile mechanism connected to the voice playing device.

In some optional implementations of the present embodiment, the intelligent voice device may be connected to the omnidirectional mobile mechanism. The voice playing device may be connected to the omnidirectional mobile mechanism. In this case, the control device may send the first motion instruction to the intelligent voice device and the voice playing device.

Step 203, sending a playing instruction, in response to determining that a relative pose of the intelligent voice device and the voice playing device is the target relative pose.

In the present embodiment, an executing body (for example, the control device shown in FIG. 1) of the method for testing an intelligent voice device may send a playing instruction, in response to determining that a relative pose of the intelligent voice device and the voice playing device is the target relative pose.

In the present embodiment, the relative pose of the intelligent voice device and the voice playing device may be determined in a variety of ways.

For example, the absolute pose of the intelligent voice device and the voice playing device may be acquired by various sensors installed on the intelligent voice device and the voice playing device, such as a position sensor and a posture sensor. The relative pose is then determined according to the absolute pose of the intelligent voice device and the voice playing device.

In the present embodiment, the playing instruction is associated with the to-be-played voice data.

In the present embodiment, the intelligent voice device may perform voice recognition on a received voice. It should be noted that the process of performing voice recognition on the received voice by the intelligent voice device may be performed by the intelligent voice device alone, or may be jointly performed by the intelligent voice device and a server providing a voice recognition function.

It should be noted that, in the case where absolute pose of one entity side is determined, determining the relative pose of the intelligent voice device and the voice playing device as the target relative pose may be achieved by determining the absolute pose of the other entity side. For example, in the case where the absolute pose of the intelligent voice device is determined, the target absolute pose of the voice playing device may be determined according to the target relative pose, and in the case where the current pose of the voice playing device is the target absolute pose, the relative pose of the intelligent voice device and the voice playing device may be determined as the target relative pose.

It should be noted that the voice playing device in the present disclosure may be one or more. The target relative pose may include the target relative pose of the intelligent voice device and each voice playing device.

Step 204, receiving predefined device information, associated with the voice recognition process, of the intelligent voice device.

In the present embodiment, an executing body (for example, the control device shown in FIG. 1) of the method for testing an intelligent voice device may receive predefined device information of the intelligent voice device.

In the present embodiment, the intelligent voice device generates various device parameters in the voice recognition process and/or after the voice recognition process, that is, these generated device parameters are associated with the voice recognition process. From a variety of the device parameters, some kinds of device parameters may be predefined as the predefined device information associated with the voice recognition.

In the present embodiment, the device information may include, but is not limited to, at least one of the following: a voice recognition result of the intelligent voice device, performance data, or log data.

Here, the performance data may include, but is not limited to, at least one of the following: a CPU usage rate of the intelligent voice device, a memory usage rate, or a hardware device temperature.

Here, the log data includes log data of an application on the intelligent voice device. The applications may include, but is not limited to, an operating system application, a voice recognition application, and a device information collecting application.

The performance data may further include: network uplink/downlink traffic, recognition time, recognition response time, recognition/wake-up delay, audio start/end point detection value, audio data processing real-time rate, recognition/wake-up initialization time, and device power.

Network uplink/downlink traffic: for calculating the traffic consumption status of online recognition.

Recognition time: the time given from the beginning of the user's speech to a final recognition result.

Recognition response time: the time given from the beginning of the user's speech to the first temporary/final (a short sentence may have no intermediate results) result.

Recognition/wake-up delay: the time from the user finishing the to-be-recognized voice/wake-up word to detecting the final recognition result/wake-up.

Audio start/end point detection value: if the length of an audio is 5 s, the user starts speaking from 1 s and finished at 4 s. The endpoint detection is used to detect the point at which the user starts to speak, i.e., 1 s and the point at which the user finishes speaking, i.e., 4 s. Due to the accuracy of the algorithm, a completely accurate start/end point detection cannot be performed, so there is a difference value. For example, an endpoint detection module gives a start point detection value of 1.2 s and an end point detection value of 4.3 s. This deviation value of 0.2 and 0.3 is used to measure the performance index of the endpoint detection. The purpose of the endpoint detection is to save traffic during online recognition. The endpoint detection module can ensure as much as possible to upload data after the user starts speaking, and filter data such as useless noise/mute.

Audio data processing real-time rate: the time it takes to process a unit audio duration. If the audio of 1 s requires processing time of 0.1 s, this value is 0.1. Under normal circumstances, it should be less than 1, otherwise the audio data will not be processed in time and then be discarded.

Recognition/wake-up initialization time: mainly for measuring the performance of an offline engine.

The offline wake-up/recognition engine is an engine that wakes up/recognizes locally without networking. Since the engine has resource files, it takes time to load and process. This index is used to measure such time, that is, the time from the start of resource loading till the offline wake-up/recognition engine is ready. Local wake-up/recognition can only be performed normally after the engine is ready.

Device power: for measuring the power consumption of the voice recognition/wake-up process. This power consumption consists of the following aspects: the usage rate of hardware units such as screen, CPU, and WiFi, and is determined by the usage rate of these hardware units together, used to measure the energy consumption of a product.

It should be noted that the log data may be used to analyze anomalies in the voice testing process. In addition, some desired information may also be extracted based on the needs of testing in practice.

Step 205, generating a test result based on the device information.

In the present embodiment, an executing body (for example, the control device shown in FIG. 1) of the method for testing an intelligent voice device may generate a test result based on the device information.

In the present embodiment, different kinds of the device information may be used to obtain different kinds of test results.

For example, the test result may include voice recognition accuracy. The voice recognition accuracy may be generated using the voice recognition result in the device information.

For example, the test result may include a hardware performance index. The CPU usage rate, memory usage rate, and hardware device temperature may be weighted and summed to generate the hardware performance index.

In some optional implementations of the present embodiment, the method illustrated in the present embodiment may also include: displaying the received device information and/or the generated test result. Thereby, it is possible to visually display the device information and/or the generated test result for reference by the staff.

In some optional implementations of the present embodiment, the test data includes spatial type information of a space in which the intelligent voice device is located. The method may further include: establishing association relationship information. The association relationship information may be used to indicate an association relationship between the spatial type information and the test result. As an example, the spatial type may be a test site type. For example, the test site type may be an open space, a large room, or a small room. More specifically, the test site type may be expressed in room size specifications. It should be noted that the test data may further include spatial type information of a space in which the voice playing device is located. The space in which the voice playing device is located may be the same as or different from the space in which the intelligent voice device is located.

Figure 4:
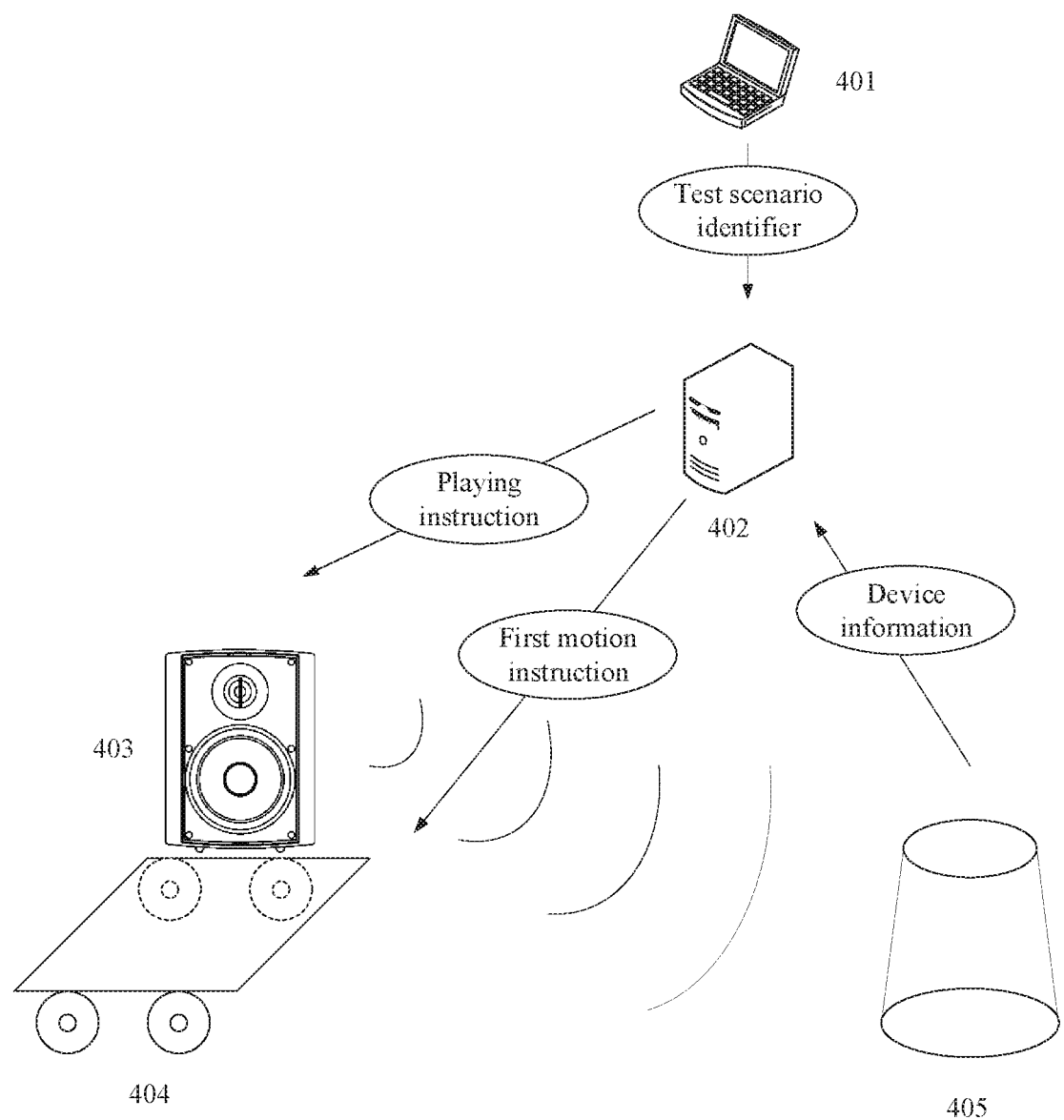
FIG. 4 is a schematic diagram of an application scenario of the method for testing an intelligent voice device according to the present disclosure.

With further reference to FIG. 4, FIG. 4 is a schematic diagram of an application scenario of the method for testing an intelligent voice device according to the present embodiment. In the application scenario of FIG. 4: the user may determine test data through a terminal device 401. For example, the user may select a test scenario identifier. The test scenario identifier is associated with the test data.

A control device 402 may acquire the test data. The test data may include to-be-executed field control data and to-be-played voice data.

The control device 402 may send a first motion instruction to an omnidirectional mobile mechanism 404 to which the voice playing device 403 is connected based on the to-be-executed field control data.

The omnidirectional mobile mechanism 404 may move carrying the voice playing device 403, in response to receiving the first motion instruction.

The control device 402 may send a playing instruction in response to determining that the relative pose of the voice playing device 403 is the target relative pose. The playing instruction is associated with the to-be-played voice data.

The voice playing device 403 may play a voice indicated by the to-be-played voice data in response to the playing instruction.

An intelligent voice device 405 may perform voice recognition on the received voice played by the voice playing device. The intelligent voice device 405 may also send to the control device 402, predefined device information associated with the voice recognition process.

The control device 402 may generate a test result based on the device information.

The method for testing an intelligent voice device provided by the present disclosure, after acquiring test data, based on the to-be-executed field control data, sending a first motion instruction to the omnidirectional mobile mechanism connected to the intelligent voice device and/or the voice playing device, so that the arrangement of a test scenario may be automatically completed; and after determining that the relative pose of the intelligent voice device and the voice playing device is the target relative pose, that is, after determining that the test scenario is arranged, sending a playing instruction and receiving device information of the intelligent voice device, and generating a test result based on the device information. Technical effects thereof at least include the following.

First, a method for testing an intelligent voice device is provided.

Secondly, the arrangement of the test scenario may be completed automatically. Thereby, the accurate arrangement of the test scenario can be achieved. In the prior art, the method of manually arranging the test scenario is usually adopted. The test scenario built in the method of the prior art has low accuracy and high labor cost.

Thirdly, the fully automatic arrangement and control of the test scenario may achieve high reproducibility of this test scenario during the process of arranging the same test scenario multiple times. Therefore, in the same test scenario of various intelligent voice devices, the test scenarios may be consistent and the accuracy of testing for the various intelligent voice devices may be improved.

In some optional implementations of the present embodiment, before the step 201, the method shown in the present disclosure may further include: acquiring a test scenario identifier set determined by a user; and determining test scenario identifiers from the test scenario identifier set in an order indicated by a test serial number. Then, the test data associated with the determined test scenario identifiers is acquired, and based on the acquired test data, a test result associated with the determined test scenario identifiers is generated. Thus, the present disclosure may complete multi-scenario order testing. The executing body may determine a test scenario, and then complete the test of the scenario by using the process shown in the flow 200; then determine the next scenario of this test scenario in order, and complete the test of the new test scenario by using the process shown in the flow 200 again.

In some optional implementations of the present embodiment, the test data further includes a test process type, where the test process type includes a fixed position test and a mobile position test. The mobile position test is associated with a relative motion speed.

The method shown in the present disclosure may further include: sending, in response to determining that the test process type of the test data includes the mobile position test, and in response to determining that the relative pose of the intelligent voice device and the voice playing device is the target relative pose, a second motion instruction to the omnidirectional mobile mechanism connected to the intelligent voice device and/or the voice playing device.

Here, the second motion instruction may be associated with an absolute motion speed.

Here, if the relative movement of the intelligent voice device and the voice playing device is implemented by the omnidirectional mobile mechanism connected to the intelligent voice device or the voice playing device, the relative motion speed is the absolute motion speed associated with the second motion instruction. If the relative movement of the intelligent voice device and the voice playing device is implemented by the omnidirectional mobile mechanism connected to the intelligent voice device and the voice playing device, the relative motion speed may be used to determine the absolute motion speeds of the omnidirectional mobile mechanisms respectively connected to the intelligent voice device and the voice playing device.

Thus, the present disclosure may test the intelligent voice device in the case where the sound source moves relative to the intelligent voice device.

In some optional implementations of the present embodiment, the to-be-played voice data may include user voice data. In this case, step 203 may include: sending a playing instruction associated with the user voice data to the voice playing device. Step 204 may include: receiving a voice recognition result of the intelligent voice device to a user voice.

Optionally, the user voice data may include user instruction voice data.

In some optional implementations of the present embodiment, the user voice data includes wake-up voice data. In this case, step 203 may include: sending a playing instruction associated with the wake-up voice data to the voice playing device. Step 204 may include: receiving a voice recognition result of a wake-up voice by the intelligent voice device.

Therefore, the present disclosure may implement a wake-up test on the intelligent voice device and generate a wake-up rate of the intelligent voice device.

In some optional implementations of the present embodiment, the to-be-played voice data includes noise data, and the noise data includes first noise data and/or second noise data. In this case, the step 203 may include at least one of the following: sending a playing instruction associated with the first noise data to the intelligent voice device; or sending a playing instruction associated with the second noise data to the voice playing device.

Therefore, the present disclosure may implement various performance tests of the intelligent voice device in a noise scenario.

It should be noted that the above noise may be noise at the voice playing device, and may also be noise at the intelligent voice device. Thus, it is possible to simulate the various performances of the intelligent voice device at the time that voice is sent by the user to the intelligent voice device during the operating process of the intelligent voice device (for example, playing a song).

In some optional implementations of the present embodiment, the test data may further include a test purpose type. The test purpose type is associated with the to-be-played voice data, and the test purpose type may include: a wake-up test, a recognition test, and a break-in wake-up test.

Here, depending on the test purpose type, the test data required may be different.

As an example, the to-be-played voice data associated with the wake-up test may include the wake-up voice data and the second noise data.

As an example, the to-be-played voice data associated with the recognition test may include the user instruction voice data and the second noise data.

As an example, the to-be-played voice data associated with the break-in wake-up test may include the wake-up voice data, the first noise data, and the second noise data.

Figure 5:
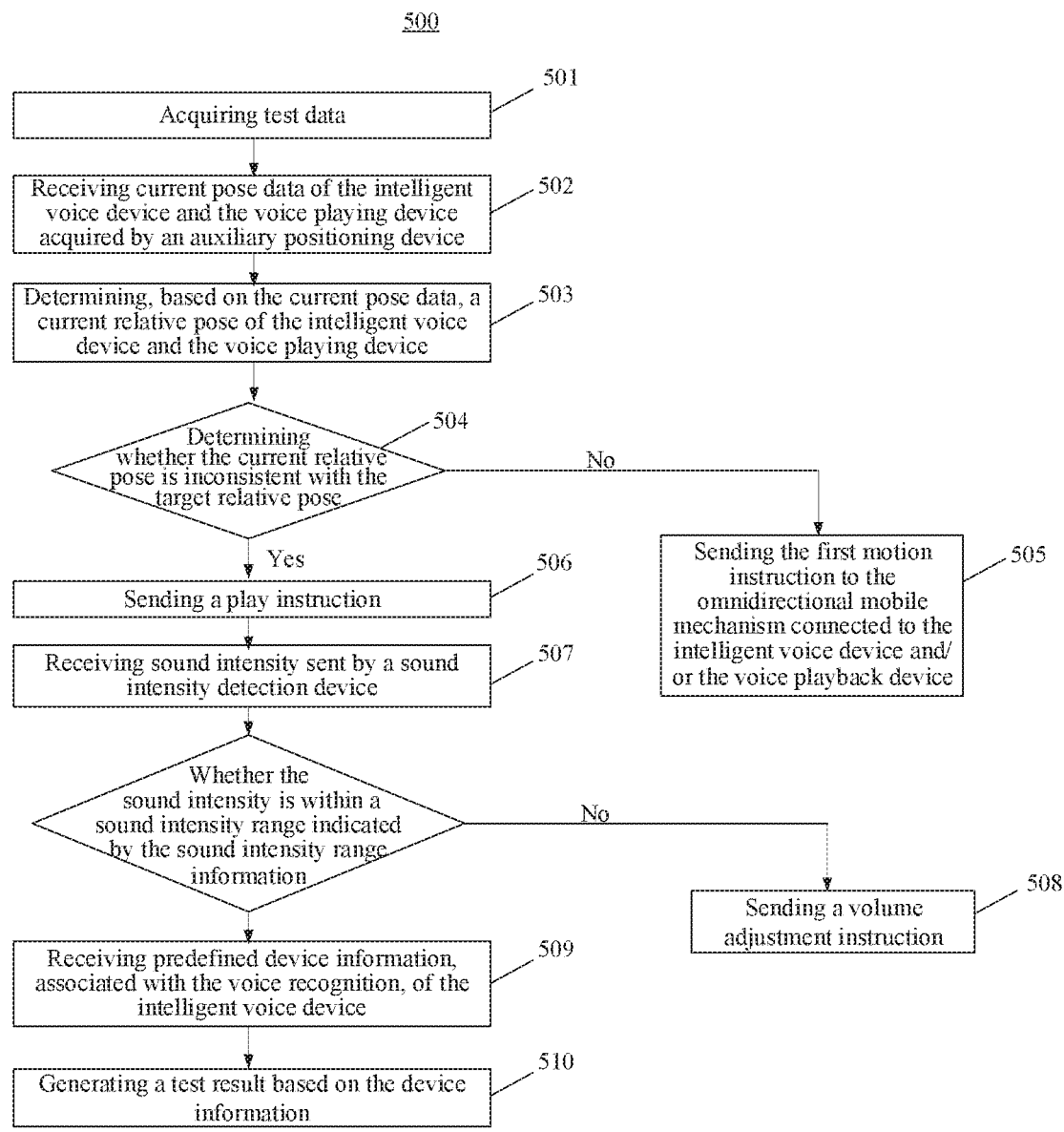
FIG. 5 is a flowchart of another embodiment of the method for testing an intelligent voice device according to the present disclosure.

With further reference to FIG. 5, a flow 500 of another embodiment of the method for testing an intelligent voice device is shown. The flow 500 of the method for testing an intelligent voice device includes the following steps.

Step 501, acquiring test data.

In the present embodiment, an executing body (for example, the control device shown in FIG. 1) of the method for testing an intelligent voice device may acquire test data.

The specific operation of step 501 in the present embodiment is substantially the same as the operation of step 201 in the embodiment shown in FIG. 2, and repeated description thereof will be omitted.

Step 502, receiving current pose data of the intelligent voice device and the voice playing device acquired by an auxiliary positioning device.

In the present embodiment, an executing body (for example, the control device shown in FIG. 1) of the method for testing an intelligent voice device may receive current pose data of the intelligent voice device and the voice playing device acquired by the auxiliary positioning device.

Figure 6:
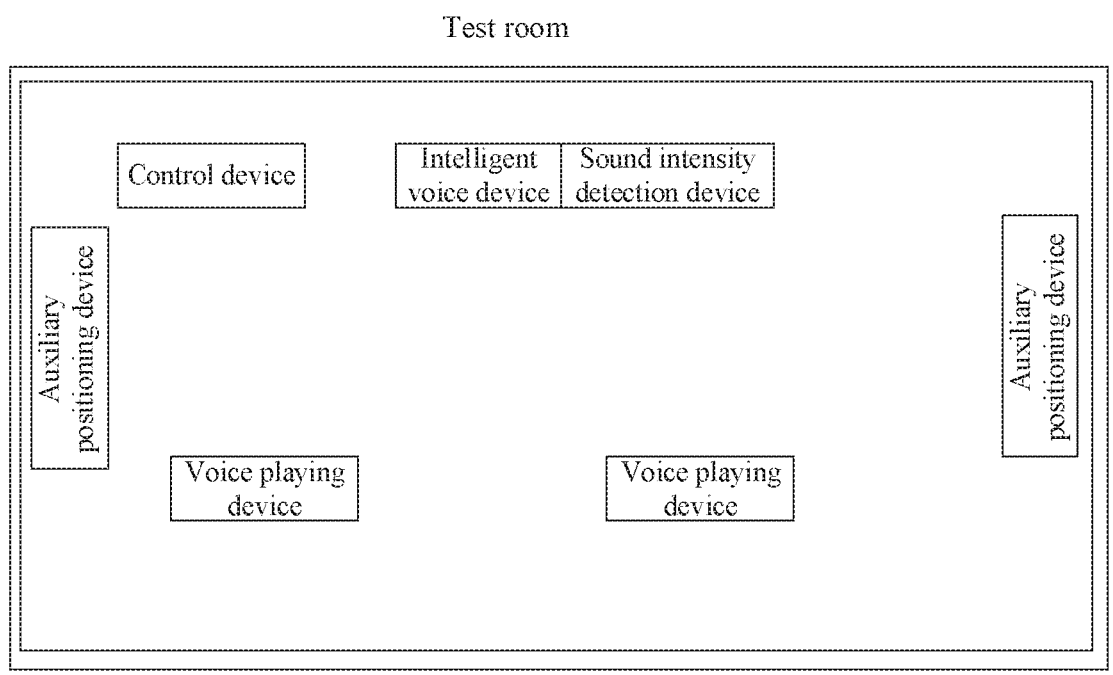
FIG. 6 is a schematic diagram of a test scenario according to the present disclosure.

Reference may be made to FIG. 6, illustrating an exemplary test scenario in which the method shown in FIG. 5 may be applied. In FIG. 6, the test site may be a test room. FIG. 6 is a schematic diagram showing the position of various electronic devices involved in the present embodiment in the test site.

Here, the auxiliary positioning device may be a device capable of positioning the position and posture of an electronic device.

Optionally, the auxiliary positioning device may be installed in the test site. The test site may be the site where the voice playing device and the intelligent voice device are located.

It should be noted that, by acquiring the current pose data by the auxiliary positioning device, the executing body needs to establish a communication connection with the auxiliary positioning device in multiple test processes. The current pose data is acquired by the sensors of the intelligent voice device and the voice playing device. In different test processes, the executing body needs to establish a communication connection with different intelligent voice devices. Therefore, by acquiring the current pose data by the auxiliary positioning device, the number of times the executing body establishes a communication connection may be reduced.

Step 503, determining, based on the current pose data, a current relative pose of the intelligent voice device and the voice playing device.

In the present embodiment, an executing body (for example, the control device shown in FIG. 1) of the method for testing an intelligent voice device may determine, based on the current pose data, a current relative pose of the intelligent voice device and the voice playing device.

Step 504, determining whether the current relative pose is inconsistent with the target relative pose.

In the present embodiment, an executing body (for example, the control device shown in FIG. 1) of the method for testing an intelligent voice device may determine whether the current relative pose is inconsistent with the target relative pose.

Step 505, sending, in response to determining that the current relative pose is inconsistent with the target relative pose, the first motion instruction to the omnidirectional mobile mechanism connected to the intelligent voice device and/or the voice playing device.

In the present embodiment, an executing body (for example, the control device shown in FIG. 1) of the method for testing an intelligent voice device may send, in response to determining that the current relative pose is inconsistent with the target relative pose, the first motion instruction to the omnidirectional mobile mechanism connected to the intelligent voice device and/or the voice playing device.

It should be noted that, in step 202, step 502-step 505 may be performed one or more times until it is determined that the relative pose of the intelligent voice device and the voice playing device is the target relative pose.

Optionally, the first motion instruction may be associated with a target position and a target posture. The omnidirectional mobile mechanism connected to the intelligent voice device and the voice playing device may move based on the target position and the target posture associated with the received first motion instruction.

Step 506, sending a playing instruction, in response to determining that a relative pose of the intelligent voice device and the voice playing device is the target relative pose.

In the present embodiment, an executing body (for example, the control device shown in FIG. 1) of the method for testing an intelligent voice device may send a playing instruction, in response to determining that a relative pose of the intelligent voice device and the voice playing device is the target relative pose.

Step 507, receiving sound intensity sent by a sound intensity detection device.

In the present embodiment, an executing body (for example, the control device shown in FIG. 1) of the method for testing an intelligent voice device may receive sound intensity sent by the sound intensity detection device.

Here, the test data further includes sound intensity range information.

Here, the sound intensity detection device is installed at the intelligent voice device, and the sound intensity is intensity of a sound received by the sound intensity detection device.

Step 508, sending a volume adjustment instruction, in response to that the sound intensity is not within a sound intensity range indicated by the sound intensity range information.

In the present embodiment, an executing body (for example, the control device shown in FIG. 1) of the method for testing an intelligent voice device may send the volume adjustment instruction, in response to the sound intensity not being within the sound intensity range indicated by the sound intensity range information.

Here, the voice playing device and/or the intelligent voice device adjusts a playing volume, in response to receiving the volume adjustment instruction.

Step 509, receiving predefined device information, associated with the voice recognition process, of the intelligent voice device.

In the present embodiment, an executing body (for example, the control device shown in FIG. 1) of the method for testing an intelligent voice device may receive predefined device information, associated with the voice recognition, of the intelligent voice device.

Step 510, generating a test result based on the device information.

In the present embodiment, an executing body (for example, the control device shown in FIG. 1) of the method for testing an intelligent voice device may generate the test result based on the device information.

As can be seen from FIG. 5, compared with the embodiment corresponding to FIG. 2, the flow 500 of the method for testing an intelligent voice device in the present embodiment highlights the steps of acquiring the pose using an auxiliary positioning device and acquiring the sound intensity using a sound intensity detection device. Therefore, the technical effects of the solution described in the present embodiment may at least include the following.

First, a new method for testing an intelligent voice device is provided.

Secondly, a communication connection with the auxiliary positioning device in the test site is established, and different intelligent voice devices in multiple tests in the test site may be positioned, so that it is not necessary to establish communication connections with different intelligent voice devices in multiple tests, which reduces the number of times of communication connections.

Thirdly, using the auxiliary positioning device, the pose is acquired multiple times, and the executing body determines whether the target relative pose is achieved, and if not, an adjustment is made. Thus improving accuracy of the test scenario arrangement.

Fourth, the sound intensity detection device detects the sound intensity at the intelligent voice device, and the executing body determines whether it is qualified. If not, the voice playing device and/or the intelligent voice device are controlled to adjust the volume. Therefore, it is possible to test various performance indexes of the intelligent voice device under different sound intensity conditions. Moreover, it may be avoided that the test is inaccurate due to the inappropriateness of the sound intensity (e.g., the intelligent voice device cannot "hear").

Figure 7:
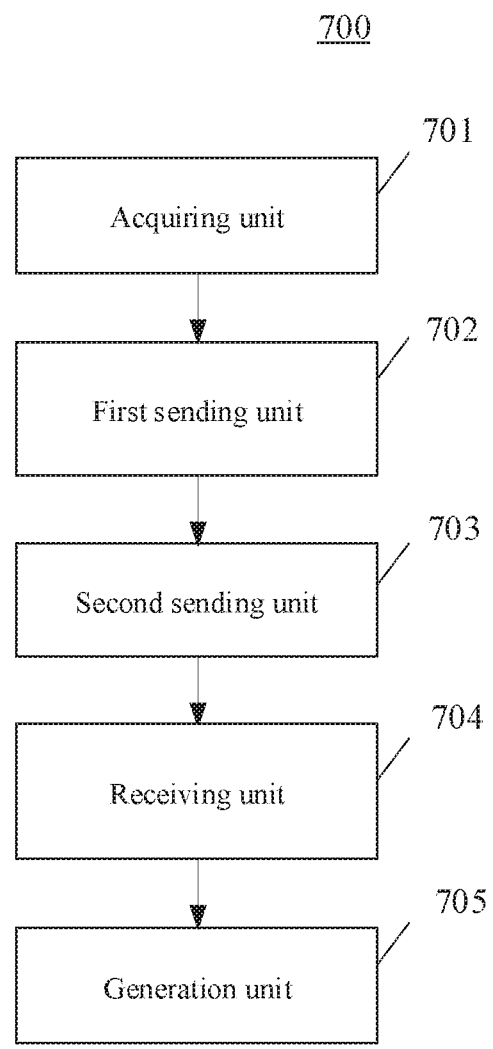
FIG. 7 is a schematic structural diagram of an embodiment of an apparatus for testing an intelligent voice device according to the present disclosure.

With further reference to FIG. 7, as an implementation of the method shown in the above figures, the present disclosure provides an embodiment of an apparatus for testing an intelligent voice device, and the apparatus embodiment corresponds to the method embodiment as shown in FIG. 2, and the apparatus may be specifically applied to various electronic devices.

As shown in FIG. 7, a device 700 for testing an intelligent voice device of the present embodiment includes: an acquiring unit 701, a first sending unit 702, a second sending unit 703, a receiving unit 704 and a generation unit 705. The acquiring unit is configured to acquire test data, where the test data includes: to-be-executed field control data and to-be-played voice data, the to-be-executed field control data is used to indicate a target relative pose between a voice playing device and an intelligent voice device, and at least one of the intelligent voice device or the voice playing device is connected to an omnidirectional mobile mechanism. The first sending unit is configured to send, based on the to-be-executed field control data, a first motion instruction to the omnidirectional mobile mechanism connected to the intelligent voice device and/or the voice playing device. The second sending unit is configured to send a playing instruction, in response to determining that a relative pose of the intelligent voice device and the voice playing device is the target relative pose, where the playing instruction is associated with the to-be-played voice data, and the intelligent voice device performs voice recognition on a received voice. The receiving unit is configured to receive predefined device information, associated with the voice recognition, of the intelligent voice device. The generation unit is configured to generate a test result based on the device information.

In the present embodiment, the specific processing and the technical effects thereof of the acquiring unit 701, the first sending unit 702, the second sending unit 703, the receiving unit 704 and the generation unit 705 of the device 700 for testing an intelligent voice device may refer to the related descriptions of the steps 201, 202, 203, 204, and 205 in the corresponding embodiment of FIG. 2, and repeated descriptions thereof will be omitted.

In some optional implementations of the present embodiment, the first sending unit is further configured to: receive current pose data of the intelligent voice device and the voice playing device acquired by an auxiliary positioning device; determine, based on the current pose data, a current relative pose of the intelligent voice device and the voice playing device; and send, in response to determining that the current relative pose is inconsistent with the target relative pose, the first motion instruction to the omnidirectional mobile mechanism connected to the intelligent voice device and/or the voice playing device.

In some optional implementations of the present embodiment, the to-be-executed field control data includes at least one of the following: a relative distance, a first angle, or a second angle, where the relative distance is a distance between the intelligent voice device and the voice playing device; the first angle is used to indicate: an angle between a connection line of center points of the intelligent voice device projected at a ground plane and the voice playing device projected at the ground plane, and a predefined first central axis in a horizontal direction of the intelligent voice device; and the second angle is used to indicate: an angle between a predefined second central axis in a horizontal direction of the voice playing device and the first central axis.

In some optional implementations of the present embodiment, the test data further includes a test process type, where the test process type includes a fixed position test and a mobile position test, where the mobile position test is associated with a relative motion speed.

In some optional implementations of the present embodiment, the device further includes: a third sending unit (not shown in the figure), configured to send, in response to determining that the test process type of the test data includes the mobile position test, and in response to determining that the relative pose of the intelligent voice device and the voice playing device is the target relative pose, a second motion instruction to the omnidirectional mobile mechanism connected to the intelligent voice device and/or the voice playing device.

In some optional implementations of the present embodiment, the test data further includes sound intensity range information; and the second sending unit, is further configured to: receive sound intensity sent by a sound intensity detection device, where the sound intensity detection device is installed at the intelligent voice device, the sound intensity is intensity of a sound received by the sound intensity detection device; and send a volume adjustment instruction, in response to the sound intensity not being within a sound intensity range indicated by the sound intensity range information, where the voice playing device and/or the intelligent voice device adjusts a playing volume, in response to receiving the volume adjustment instruction.

In some optional implementations of the present embodiment, the to-be-played voice data includes user voice data; and the second sending unit, is further configured to: send a playing instruction associated with the user voice data to the voice playing device; and the receiving unit, is further configured to receive a voice recognition result of a user voice played by the intelligent voice device to the voice playing device.

In some optional implementations of the present embodiment, the user voice data includes wake-up voice data; and the second sending unit, is further configured to: send a playing instruction associated with the wake-up voice data to the voice playing device; and the receiving unit, is further configured to receive a voice recognition result of a wake-up voice played by the intelligent voice device to the voice playing device.

In some optional implementations of the present embodiment, the to-be-played voice data includes noise data, where the noise data includes first noise data and/or second noise data; and the second sending unit, is further configured to: send a playing instruction associated with the first noise data to the intelligent voice device; and send a playing instruction associated with the second noise data to the voice playing device.

In some optional implementations of the present embodiment, the test data further includes a test purpose type, where the test purpose type is associated with the to-be-played voice data, and the test purpose type includes: a wake-up test, a recognition test, and a break-in wake-up test.

In some optional implementations of the present embodiment, before acquiring test data, the device further includes: a set acquiring unit (not shown in the figure), configured to: acquire a test scenario identifier set determined by a user, where a test scenario identifier is associated with the test data and a test serial number; determine test scenario identifiers from the test scenario identifier set in an order indicated by the test serial number; and the acquiring unit, is further configured to acquire the test data associated with the determined test scenario identifiers.

In some optional implementations of the present embodiment, the device information includes at least one of the following: a voice recognition result of the intelligent voice device, performance data, or log data, where the performance data includes at least one of the following: a CPU usage rate of the intelligent voice device, a memory usage rate, or a hardware device temperature, and the log data includes log data of an application on the intelligent voice device.

In some optional implementations of the present embodiment, the device further includes: a display unit (not shown in the figure), configured to display the received device information and/or the generated test result.

In some optional implementations of the present embodiment, the test data includes spatial type information of a space in which the intelligent voice device is located; and the device further includes: an establishing unit (not shown in the figure), configured to establish association relationship information, where the association relationship information is used to indicate an association relationship between the spatial type information and the test result.

It should be noted that the implementation details and technical effects of the units in the apparatus for testing an intelligent voice device provided by the embodiments of the present disclosure may be referred to the description of other embodiments in the present disclosure, and repeated descriptions thereof will be omitted.

Figure 8:
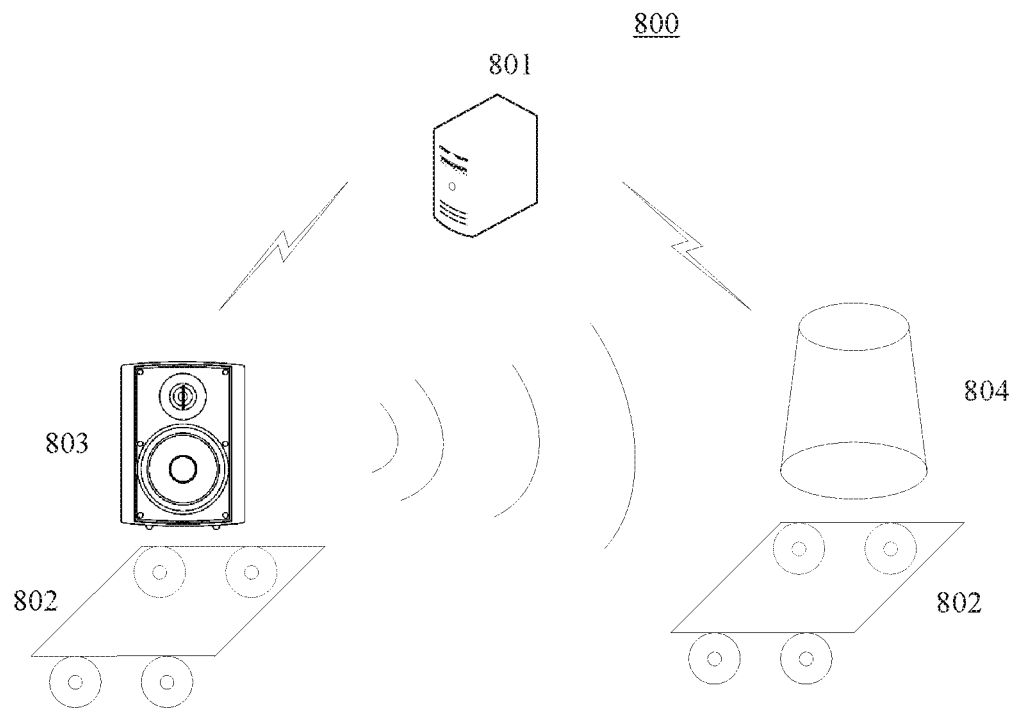
FIG. 8 is a schematic structural diagram of an embodiment of a system for testing an intelligent voice device according to the present disclosure.

With further reference to FIG. 8, as an implementation of the method shown in the above figures, the present disclosure provides an embodiment of a system for testing an intelligent voice device, and the system embodiment corresponds to the method embodiment as shown in FIG. 2.

As shown in FIG. 8, a system 800 for testing an intelligent voice device of the present embodiment may include: a control device 801, configured to: acquire test data, where the test data includes: to-be-executed field control data and to-be-played voice data, the to-be-executed field control data is used to indicate a target relative pose between a voice playing device and an intelligent voice device; send, based on the to-be-executed field control data, a first motion instruction to an omnidirectional mobile mechanism connected to the intelligent voice device and/or the voice playing device; and send a playing instruction, in response to determining that a relative pose of the intelligent voice device and the voice playing device is the target relative pose, the playing instruction being associated with the to-be-played voice data; the omnidirectional mobile mechanism 802, configured to connect to at least one of the intelligent voice device and the voice playing device, in response to receiving the first motion instruction; the voice playing device 803, configured to play a voice indicated by the to-be-played voice data associated with the received playing instruction; the intelligent voice device 804, configured to: perform voice recognition on a received voice; collect and send predefined device information, associated with the voice recognition, of the intelligent voice device; and the control device, further configured to: receive the predefined device information associated with the voice recognition of the intelligent voice device; and generate a test result based on the device information.

In some optional implementations of the present embodiment, the test data further includes sound intensity range information; and the system further includes: a sound intensity detection device (not shown in the figure), installed at the intelligent voice device, configured to: determine sound intensity of a received sound; send the sound intensity to the control device; and the control device, is further configured to receive the sound intensity sent by the sound intensity detection device; send a volume adjustment instruction, in response to the sound intensity not being within a sound intensity range indicated by the sound intensity range information, where the voice playing device and/or the intelligent voice device adjusts a playing volume, in response to receiving the volume adjustment instruction.

In some optional implementations of the present embodiment, the system further includes: an auxiliary positioning device (not shown in the figure), configured to acquire and send current pose data of the intelligent voice device and the voice playing device; and the control device is further configured to: determine, based on the current pose data, a current relative pose of the intelligent voice device and the voice playing device; and send, in response to determining that the current relative pose is inconsistent with the target relative pose, the first motion instruction to the omnidirectional mobile mechanism connected to the intelligent voice device and/or the voice playing device.

In some optional implementations of the present embodiment, the control device is further configured to: receive current pose data of the intelligent voice device and the voice playing device acquired by the auxiliary positioning device; determine, based on the current pose data, a current relative pose of the intelligent voice device and the voice playing device; and send, in response to determining that the current relative pose is inconsistent with the target relative pose, the first motion instruction to the omnidirectional mobile mechanism connected to the intelligent voice device and/or the voice playing device.

In some optional implementations of the present embodiment, the to-be-executed field control data includes at least one of the following: a relative distance, a first angle, or a second angle, where the relative distance is a distance between the intelligent voice device and the voice playing device; the first angle is used to indicate: an angle between a center point connection line of the intelligent voice device and the voice playing device projected at a ground plane, and a predefined first central axis in a horizontal direction of the intelligent voice device; and the second angle is used to indicate: an angle between a predefined second central axis in a horizontal direction of the voice playing device and the first central axis.

In some optional implementations of the present embodiment, the test data further includes a test process type, where the test process type includes a fixed position test and a mobile position test, where the mobile position test is associated with a relative motion speed.

In some optional implementations of the present embodiment, the control device is further configured to: send, in response to determining that the test process type of the test data includes the mobile position test, and in response to determining that the relative pose of the intelligent voice device and the voice playing device is the target relative pose, a second motion instruction to the omnidirectional mobile mechanism connected to the intelligent voice device and/or the voice playing device.

In some optional implementations of the present embodiment, the test data further includes sound intensity range information; and the control device is further configured to: receive sound intensity sent by a sound intensity detection device, where the sound intensity detection device is installed at the intelligent voice device, the sound intensity is intensity of a sound received by the sound intensity detection device; and send a volume adjustment instruction, in response to the sound intensity not being within a sound intensity range indicated by the sound intensity range information, where the voice playing device and/or the intelligent voice device adjusts a playing volume, in response to receiving the volume adjustment instruction.

In some optional implementations of the present embodiment, the to-be-played voice data includes user voice data; and the control device is further configured to: send a playing instruction associated with the user voice data to the voice playing device; and receive a voice recognition result of a user voice played by the intelligent voice device to the voice playing device.

In some optional implementations of the present embodiment, the user voice data includes wake-up voice data; and the control device is further configured to: send a playing instruction associated with the wake-up voice data to the voice playing device; and receive a voice recognition result of a wake-up voice played by the intelligent voice device to the voice playing device.

In some optional implementations of the present embodiment, the to-be-played voice data includes noise data, where the noise data includes first noise data and/or second noise data; and the control device is further configured to: send a playing instruction associated with the first noise data to the intelligent voice device; and send a playing instruction associated with the second noise data to the voice playing device.

In some optional implementations of the present embodiment, the test data further includes a test purpose type, where the test purpose type is associated with the to-be-played voice data, and the test purpose type includes: a wake-up test, a recognition test, and a break-in wake-up test.

In some optional implementations of the present embodiment, the control device is further configured to: acquire a test scenario identifier set determined by a user, where a test scenario identifier is associated with the test data and a test serial number; determine test scenario identifiers from the test scenario identifier set in an order indicated by the test serial number; and acquire the test data associated with the determined test scenario identifiers.

In some optional implementations of the present embodiment, the device information includes at least one of the following: a voice recognition result of the intelligent voice device, performance data, or log data, where the performance data includes at least one of the following: a CPU usage rate of the intelligent voice device, a memory usage rate, or a hardware device temperature, and the log data includes log data of an application on the intelligent voice device.

In some optional implementations of the present embodiment, the control device is further configured to: display the received device information and/or the generated test result.

In some optional implementations of the present embodiment, the test data includes spatial type information of a space in which the intelligent voice device is located; and the control device is further configured to: establish association relationship information, where the association relationship information is used to indicate an association relationship between the spatial type information and the test result.

It should be noted that the implementation details and technical effects of the devices in the system for testing an intelligent voice device provided by the embodiments of the present disclosure may be referred to the description of other embodiments in the present disclosure, and repeated descriptions thereof will be omitted.

Figure 9:
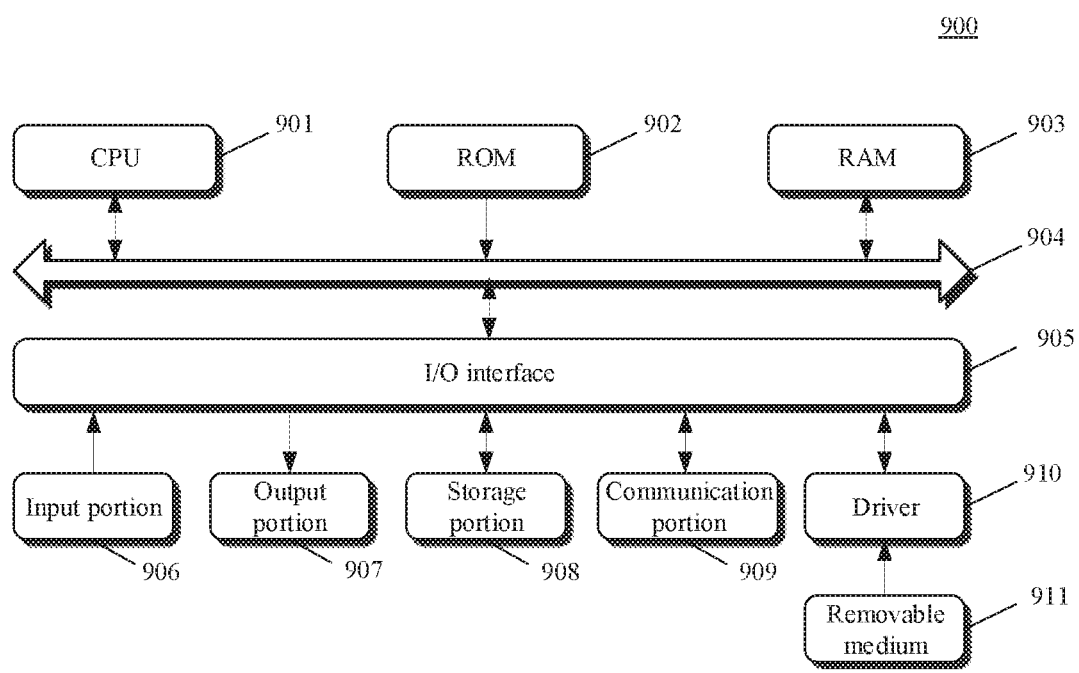
FIG. 9 is a schematic structural diagram of a computer system adapted to implement a terminal device or server of the embodiments of the present disclosure.

With further reference to FIG. 9, a schematic structural diagram of a computer system 900 adapted to implement a terminal device or server of the embodiments of the present disclosure is shown. The terminal device or server shown in FIG. 9 is merely an example, and should not impose any limitation on the function and scope of use of the embodiments of the present disclosure.

As shown in FIG. 9, the computer system 900 includes a central processing unit (CPU) 901, which may execute various appropriate actions and processes in accordance with a program stored in a read-only memory (ROM) 902 or a program loaded into a random access memory (RAM) 903 from a storage portion 908. The RAM 903 also stores various programs and data required by operations of the system 900. The CPU 901, the ROM 902 and the RAM 903 are connected to each other through a bus 904. An input/output (I/O) interface 905 is also connected to the bus 904.

The following components are connected to the I/O interface 905: an input portion 906 including a keyboard, a mouse, etc.; an output portion 907 including such as a cathode ray tube (CRT), a liquid crystal display device (LCD), a speaker; a storage portion 908 including a hard disk or the like; and a communication portion 909 including a network interface card, such as a LAN card and a modem. The communication portion 909 performs communication processes via a network, such as the Internet. A driver 910 is also connected to the I/O interface 905 as required. A removable medium 911, such as a magnetic disk, an optical disk, a magneto-optical disk, and a semiconductor memory, may be installed on the driver 910, to facilitate the retrieval of a computer program from the removable medium 911, and the installation thereof on the storage portion 908 as needed.

In particular, according to the embodiments of the present disclosure, the process described above with reference to the flow chart may be implemented in a computer software program. For example, an embodiment of the present disclosure includes a computer program product, which includes a computer program that is tangibly embedded in a computer-readable medium. The computer program includes program codes for performing the method as illustrated in the flow chart. In such an embodiment, the computer program may be downloaded and installed from a network via the communication portion 909, and/or may be installed from the removable medium 911. The computer program, when executed by the central processing unit (CPU) 901, implements the above mentioned functionalities as defined by the method of the present disclosure. It should be noted that the computer readable medium in the present disclosure may be computer readable signal medium or computer readable storage medium or any combination of the above two. An example of the computer readable storage medium may include, but not limited to: electric, magnetic, optical, electromagnetic, infrared, or semiconductor systems, apparatus, devices, or a combination of any of the above. A more specific example of the computer readable storage medium may include but is not limited to: electrical connection with one or more wire, a portable computer disk, a hard disk, a random access memory (RAM), a read only memory (ROM), an erasable programmable read only memory (EPROM or flash memory), a fiber, a portable compact disk read only memory (CD-ROM), an optical memory, a magnet memory or any suitable combination of the above. In the present disclosure, the computer readable storage medium may be any physical medium containing or storing programs which may be used by a command execution system, apparatus or devices or incorporated thereto. In the present disclosure, the computer readable signal medium may include data signal in the base band or propagating as parts of a carrier, in which computer readable program codes are carried. The propagating data signal may take various forms, including but not limited to: an electromagnetic signal, an optical signal or any suitable combination of the above. The signal medium that can be read by computer may be any computer readable medium except for the computer readable storage medium. The computer readable medium is capable of transmitting, propagating or transferring programs for use by, or used in combination with, a command execution system, apparatus or device. The program codes contained on the computer readable medium may be transmitted with any suitable medium including but not limited to: wireless, wired, optical cable, RF medium etc., or any suitable combination of the above.

A computer program code for performing operations in the present disclosure may be compiled using one or more programming languages or combinations thereof. The programming languages include object-oriented programming languages, such as Java, Smalltalk or C++, and also include conventional procedural programming languages, such as "C" language or similar programming languages. The program code may be completely executed on a user's computer, partially executed on a user's computer, executed as a separate software package, partially executed on a user's computer and partially executed on a remote computer, or completely executed on a remote computer or server. In the circumstance involving a remote computer, the remote computer may be connected to a user's computer through any network, including local area network (LAN) or wide area network (WAN), or may be connected to an external computer (for example, connected through Internet using an Internet service provider).

The flow charts and block diagrams in the accompanying drawings illustrate architectures, functions and operations that may be implemented according to the systems, methods and computer program products of the various embodiments of the present disclosure. In this regard, each of the blocks in the flow charts or block diagrams may represent a module, a program segment, or a code portion, said module, program segment, or code portion including one or more executable instructions for implementing specified logic functions. It should also be noted that, in some alternative implementations, the functions denoted by the blocks may occur in a sequence different from the sequences shown in the accompanying drawings. For example, any two blocks presented in succession may be executed, substantially in parallel, or they may sometimes be in a reverse sequence, depending on the function involved. It should also be noted that each block in the block diagrams and/or flow charts as well as a combination of blocks may be implemented using a dedicated hardware-based system performing specified functions or operations, or by a combination of a dedicated hardware and computer instructions.

The units involved in the embodiments of the present disclosure may be implemented by means of software or hardware. The described units may also be provided in a processor, for example, described as: a processor, including an acquiring unit, a first sending unit, a second sending unit, a receiving unit and a generation unit. Here, the names of these units do not in some cases constitute a limitation to such units themselves. For example, the acquiring unit may also be described as "a unit for acquiring test data."

In another aspect, the present disclosure further provides a computer readable medium. The computer readable medium may be included in the device in the above described embodiments, or a stand-alone computer readable medium not assembled into the device. The computer readable medium stores one or more programs. The one or more programs, when executed by the device, cause the device to: acquire test data, where the test data includes: to-be-executed field control data and to-be-played voice data, the to-be-executed field control data is used to indicate a target relative pose between a voice playing device and an intelligent voice device, and at least one of the intelligent voice device and the voice playing device is connected to an omnidirectional mobile mechanism; send, based on the to-be-executed field control data, a first motion instruction to the omnidirectional mobile mechanism connected to the intelligent voice device and/or the voice playing device; send a playing instruction, in response to determining that a relative pose of the intelligent voice device and the voice playing device is the target relative pose, where the playing instruction is associated with the to-be-played voice data, and the intelligent voice device performs voice recognition on a received voice; receive predefined device information, associated with the voice recognition, of the intelligent voice device; and generate a test result based on the device information.

The above description only provides an explanation of the preferred embodiments of the present disclosure and the technical principles used. It should be appreciated by those skilled in the art that the inventive scope of the present disclosure is not limited to the technical solutions formed by the particular combinations of the above-described technical features. The inventive scope should also cover other technical solutions formed by any combinations of the above-described technical features or equivalent features thereof without departing from the concept of the present disclosure. Technical schemes formed by the above-described features being interchanged with, but not limited to, technical features with similar functions disclosed in the present disclosure are examples.

What is claimed is:

1. A method for testing an intelligent voice device, the method comprising:
    acquiring test data, wherein the test data comprises: to-be-executed field control data and to-be-played voice data, the to-be-executed field control data indicates a target relative pose between a voice playing device and an intelligent voice device, and at least one of the intelligent voice device or the voice playing device is connected to an omnidirectional mobile mechanism;
    sending, based on the to-be-executed field control data, a first motion instruction to the omnidirectional mobile mechanism connected to the intelligent voice device and/or the voice playing device;
    sending a playing instruction, in response to determining a relative pose of the intelligent voice device and the voice playing device being the target relative pose, wherein the playing instruction is associated with the to-be-played voice data, and the intelligent voice device performs voice recognition on a received voice;
    receiving predefined device information, associated with the voice recognition, of the intelligent voice device; and
    generating a test result based on the device information;
    wherein the test data further comprises sound intensity range information; and
    the sending a playing instruction, comprises:
    receiving sound intensity sent by a sound intensity detection device, wherein the sound intensity detection device is installed at the intelligent voice device, wherein the sound intensity is intensity of a sound received by the sound intensity detection device; and
    sending a volume adjustment instruction, in response to that the sound intensity is not within a sound intensity range indicated by the sound intensity range information, wherein the voice playing device and/or the intelligent voice device adjusts a playing volume, in response to receiving the volume adjustment instruction.

2. The method according to claim 1, wherein the sending, based on the to-be-executed field control data, a first motion instruction to the omnidirectional mobile mechanism connected to the intelligent voice device and/or the voice playing device, comprises:
    receiving current pose data of the intelligent voice device and the voice playing device acquired by an auxiliary positioning device;
    determining, based on the current pose data, a current relative pose of the intelligent voice device and the voice playing device; and
    sending, in response to determining the current relative pose being inconsistent with the target relative pose, the first motion instruction to the omnidirectional mobile mechanism connected to the intelligent voice device and/or the voice playing device.

3. The method according to claim 1, wherein the to-be-executed field control data comprises at least one item consisting of: a relative distance, a first angle, or a second angle, wherein the relative distance is a distance between the intelligent voice device and the voice playing device; the first angle is used to indicate: an angle between a connection line of center points of the intelligent voice device projected at a ground plane and the voice playing device projected at the ground plane, and a predefined first central axis in a horizontal direction of the intelligent voice device; and the second angle is used to indicate: an angle between a predefined second central axis in a horizontal direction of the voice playing device, and the first central axis.

4. The method according to claim 1, wherein the test data further comprises a test process type, wherein the test process type comprises a fixed position test and a mobile position test, wherein the mobile position test is associated with a relative motion speed.

5. The method according to claim 4, wherein the method further comprises:
    sending, in response to determining that the test process type of the test data comprises the mobile position test, and in response to determining that the relative pose of the intelligent voice device and the voice playing device is the target relative pose, a second motion instruction to the omnidirectional mobile mechanism connected to the intelligent voice device and/or the voice playing device.

6. The method according to claim 1, wherein the to-be-played voice data comprises user voice data; and
    the sending a playing instruction, comprises:
    sending a playing instruction associated with the user voice data to the voice playing device; and
    the receiving predefined device information, associated with the voice recognition, of the intelligent voice device, comprises:
    receiving a voice recognition result of a user voice played by the intelligent voice device to the voice playing device.

7. The method according to claim 6, wherein the user voice data comprises wake-up voice data; and
    the sending a playing instruction, comprises:
    sending a playing instruction associated with the wake-up voice data to the voice playing device; and
    the receiving predefined device information, associated with the voice recognition, of the intelligent voice device, comprises:
    receiving a voice recognition result of a wake-up voice played by the intelligent voice device to the voice playing device.

8. The method according to claim 7, wherein the to-be-played voice data comprises noise data, wherein the noise data comprises first noise data and/or second noise data; and
    the sending a playing instruction, comprises at least one of:
    sending a playing instruction associated with the first noise data to the intelligent voice device; or
    sending a playing instruction associated with the second noise data to the voice playing device.

9. The method according to claim 8, wherein the test data further comprises a test purpose type, wherein the test purpose type is associated with the to-be-played voice data, and the test purpose type comprises: a wake-up test, a recognition test, and a break-in wake-up test.

10. The method according to claim 9, wherein before the acquiring test data, the method further comprises:
acquiring a test scenario identifier set determined by a user, wherein a test scenario identifier is associated with the test data and a test serial number;
determining the test scenario identifiers from the test scenario identifier set in an order indicated by the test serial number; and
the acquiring test data, comprises:
acquiring the test data associated with the determined test scenario identifiers.

11. The method according to claim 10, wherein the device information comprises at least one item consisting of: a voice recognition result of the intelligent voice device, performance data, or log data, wherein the performance data comprises at least one item consisting of: a CPU usage rate of the intelligent voice device, a memory usage rate, or a hardware device temperature, and the log data comprises log data of an application on the intelligent voice device.

12. The method according to claim 11, wherein the method further comprises:
displaying the received device information and/or the generated test result.

13. The method according to claim 12, wherein the test data comprises spatial type information of a space in which the intelligent voice device is located; and
the method further comprises:
establishing association relationship information, wherein the association relationship information indicates an association relationship between the spatial type information and the test result.

14. An apparatus for testing an intelligent voice device, the device comprising:
at least one processor; and
a memory storing instructions, wherein the instructions when executed by the at least one processor, cause the at least one processor to perform operations, the operations comprising:
acquiring test data, wherein the test data comprises: to-be-executed field control data and to-be-played voice data, the to-be-executed field control data indicates a target relative pose between a voice playing device and an intelligent voice device, and at least one of the intelligent voice device or the voice playing device is connected to an omnidirectional mobile mechanism;
sending, based on the to-be-executed field control data, a first motion instruction to the omnidirectional mobile mechanism connected to the intelligent voice device and/or the voice playing device;
sending a playing instruction, in response to determining that a relative pose of the intelligent voice device and the voice playing device is the target relative pose, wherein the playing instruction is associated with the to-be-played voice data, and the intelligent voice device performs voice recognition on a received voice;
receiving predefined device information, associated with the voice recognition, of the intelligent voice device; and
generating a test result based on the device information;
wherein the test data further comprises sound intensity range information; and
the sending a playing instruction, comprises:
receiving sound intensity sent by a sound intensity detection device, wherein the sound intensity detection device is installed at the intelligent voice device, wherein the sound intensity is intensity of a sound received by the sound intensity detection device; and
sending a volume adjustment instruction, in response to that the sound intensity is not within a sound intensity range indicated by the sound intensity range information, wherein the voice playing device and/or the intelligent voice device adjusts a playing volume, in response to receiving the volume adjustment instruction.

15. A system for testing an intelligent voice device, the system comprising:
a control device, configured to: acquire test data, the test data comprises: to-be-executed field control data and to-be-played voice data, wherein the to-be-executed field control data indicates a target relative pose between a voice playing device and an intelligent voice device; send, based on the to-be-executed field control data, a first motion instruction to an omnidirectional mobile mechanism connected to the intelligent voice device and/or the voice playing device; and send a playing instruction, in response to determining that a relative pose of the intelligent voice device and the voice playing device is the target relative pose, wherein the playing instruction is associated with the to-be-played voice data;
the omnidirectional mobile mechanism, configured to connect to at least one of the intelligent voice device or the voice playing device, in response to receiving the first motion instruction;
the voice playing device, configured to play a voice indicated by the to-be-played voice data associated with the received playing instruction; and
the intelligent voice device, configured to: perform voice recognition on a received voice; and collect and send predefined device information, associated with the voice recognition, of the intelligent voice device;
wherein the control device is further configured to: receive the predefined device information, associated with the voice recognition, of the intelligent voice device; and generate a test result based on the device information;
wherein the test data further comprises sound intensity range information; and
the system further comprises:
a sound intensity detection device, installed at the intelligent voice device, configured to: determine sound intensity of a received sound; and send the sound intensity to the control device; and
the control device, is further configured to receive the sound intensity sent by the sound intensity detection device; and send a volume adjustment instruction, in response to that the sound intensity is not within a sound intensity range indicated by the sound intensity range information, wherein the voice playing device and/or the intelligent voice device adjusts a playing volume, in response to receiving the volume adjustment instruction.

16. The system according to claim 15, wherein the system further comprises:
an auxiliary positioning device, configured to acquire and send current pose data of the intelligent voice device and the voice playing device; and
the control device is further configured to: determine, based on the current pose data, a current relative pose of the intelligent voice device and the voice playing device; and send, in response to determining that the current relative pose is inconsistent with the target relative pose, the first motion instruction to the omnidirectional mobile mechanism connected to the intelligent voice device and/or the voice playing device.

17. A non-transitory computer readable medium, storing a computer program thereon, wherein the program, when executed by a processor, implements the method according to claim 1.

* * * * *